United States Patent
Nakanishi et al.

(10) Patent No.: US 9,110,315 B2
(45) Date of Patent: Aug. 18, 2015

(54) OPTICAL DEVICE, MODULATOR MODULE, AND METHOD FOR MANUFACTURING THE OPTICAL DEVICE

(75) Inventors: Akira Nakanishi, Kanagawa (JP); Hideo Arimoto, Tokyo (JP); Hiroaki Hayashi, Yamaguchi (JP); Shigeki Makino, Tokyo (JP); Kazunori Shinoda, Tokyo (JP)

(73) Assignee: Oclaro Japan, Inc., Kanagawa (JP)

( * ) Notice: Subject to any disclaimer, the term of this patent is extended or adjusted under 35 U.S.C. 154(b) by 496 days.

(21) Appl. No.: 13/488,511

(22) Filed: Jun. 5, 2012

(65) Prior Publication Data

US 2012/0314725 A1  Dec. 13, 2012

(30) Foreign Application Priority Data

Jun. 7, 2011 (JP) ................................. 2011-126950

(51) Int. Cl.
| | |
|---|---|
| G02B 6/12 | (2006.01) |
| G02F 1/025 | (2006.01) |
| H01S 5/026 | (2006.01) |
| G02F 1/225 | (2006.01) |
| H01S 5/12 | (2006.01) |
| H01S 5/227 | (2006.01) |

(52) U.S. Cl.
CPC ............. *G02F 1/025* (2013.01); *G02F 1/2257* (2013.01); *H01S 5/0265* (2013.01); *G02B 2006/12097* (2013.01); *G02B 2006/12135* (2013.01); *G02B 2006/12142* (2013.01); *G02F 2201/063* (2013.01); *G02F 2201/50* (2013.01); *H01S 5/12* (2013.01); *H01S 5/227* (2013.01)

(58) Field of Classification Search
None
See application file for complete search history.

(56) References Cited

U.S. PATENT DOCUMENTS

| | | | |
|---|---|---|---|
| 6,999,638 B2* | 2/2006 | Yamada | 385/2 |
| 7,593,445 B2* | 9/2009 | Sasada et al. | 372/50.11 |
| 8,124,543 B2* | 2/2012 | Yagi et al. | 438/737 |
| 8,526,478 B2* | 9/2013 | Ishimura et al. | 372/50.1 |
| 2007/0297475 A1 | 12/2007 | Sasada et al. | |
| 2010/0303115 A1 | 12/2010 | Yagi et al. | |

FOREIGN PATENT DOCUMENTS

| | | |
|---|---|---|
| JP | 2003-298190 A | 10/2003 |
| JP | 2004-071713 A | 3/2004 |
| JP | 2008-010484 A | 1/2008 |
| JP | 2009-004524 A | 1/2009 |
| JP | 2010-278154 A | 12/2010 |

OTHER PUBLICATIONS

Japanese Office Action received in corresponding Japanese Application No. 2011-126950 dated Nov. 18, 2014.

* cited by examiner

*Primary Examiner* — Michelle R Connelly
*Assistant Examiner* — John M Bedtelyon
(74) *Attorney, Agent, or Firm* — Mattingly & Malur, PC

(57) ABSTRACT

An optical device includes a ridge-like optical waveguide portion, a mesa protector portion that is arranged in parallel to the optical waveguide portion, a resin portion that covers upper parts of the mesa protector portion and is disposed at both sides of the mesa protector portion, an electrode that is disposed on the optical waveguide portion, an electrode pad that is disposed on the resin portion located at an opposite side to the optical waveguide portion with respect to the mesa protector portion, and a connection portion that is disposed on the resin portion and electrically connects the electrode to the electrode pad.

17 Claims, 15 Drawing Sheets

OPTICAL DEVICE, MODULATOR MODULE, AND METHOD FOR MANUFACTURING THE OPTICAL DEVICE

CROSS-REFERENCE TO RELATED APPLICATION

The present application claims priority from Japanese Application JP2011-126950 filed on Jun. 7, 2011, the content to which is hereby incorporated by reference into this application.

BACK GROUND OF THE INVENTION

1. Field of the Invention

The present invention relates to an optical device, a modulator module including the optical device, a laser integrated modulator module including the optical device, and a manufacturing method of the optical device.

2. Description of the Related Art

It is known that a light confinement coefficient in an optical waveguide or a parasitic capacitance of an electrode on the optical waveguide has a considerable influence on various characteristics of an optical device having a ridge-like optical waveguide structure. For example, it is known that the larger the light confinement coefficient, the larger the refractive index variation, and the smaller the parasitic capacitance, the larger the band, in an optical device using a refractive index variation when an electric field is applied thereto, such as a semiconductor MZ modulator, which is a modulator using a Mach-Zehnder interferometer, Here, when the ridge-like optical waveguide included in the above-described semiconductor MZ modulator is classified in terms of the height of a mesa of the optical waveguide, it is largely classified into a low mesa optical waveguide, in which an active layer is located under a ridge portion and thus the width of the active layer is sufficiently greater than the width of the ridge-like optical waveguide, and a high mesa optical waveguide, in which the width of the active layer is the same as the width of the ridge-like optical waveguide.

Upon comparison of the high mesa optical waveguide and the low mesa optical waveguide, the high mesa optical waveguide has higher light confinement coefficient and the parasitic capacitance characteristics than the low mesa optical waveguide. Specifically, since, in the high mesa optical waveguide, a side surface of the active layer made of semiconductor has an interface with a material having a large refractive index difference such as air or a low dielectric material, the light confinement coefficient is large, and a refractive index variation when an electric field is applied thereto is larger than in the low mesa optical waveguide. In addition, in the high mesa optical waveguide, the width of the active layer is the same as the width of the electrode, which leads to low parasitic capacitance, and thus it is advantageous in a high speed operation. Particularly, since, in the semiconductor MZ modulator, a refractive index variation in an optical waveguide layer is small and the optical waveguide is required to be formed long, the influence of the parasitic capacitance is increased. Therefore, the high mesa optical waveguide having low parasitic capacitance is useful for a high speed operation (refer to S. Akiyama, et. al., "40 Gb/s InP-based Mach-Zehnder modulator with a driving voltage of 3Vpp" IEEE. International. Conf., Kagoshima, Japan, 2004, ThA1-4).

Further, generally, in a semiconductor laser device, the optical waveguide is formed in a reverse mesa direction. In contrast, in a modulator using a refractive index variation when a voltage is applied thereto such as the semiconductor MZ modulator, the optical waveguide is formed in a forward mesa direction. Thereby, an excellent modulation characteristic can be expected. This is because a Pockels effect is higher and a refractive index variation at the time of application of a voltage is larger in the forward mesa direction than in the reverse mesa direction. As explained above, the high mesa optical waveguide of the forward mesa direction is a waveguide structure useful for a modulation characteristic and a high speed operation of the MZ modulator.

Here, in order to prevent the ridge-like waveguide from being damaged in a manufacturing process of the above-described semiconductor laser device, it is known that a ridge protection layer, which is made of a bank-shaped semiconductor material and is higher than the waveguide, is provided at both sides of the waveguide with a space region interposed therebetween (refer to JP2003-298190 A).

SUMMARY OF THE INVENTION

In the MZ modulator having the above-described high mesa optical waveguide, the mesa has a thin and long shape. Specifically, for example, the width of the mesa is about 1 to 2 µm, the height of the mesa is about 4 to 5 µm, and the length of the mesa is about 1000 to 2000 µm. Therefore, in a manufacturing process thereof, there is a problem that a possibility of mechanical contact of the mesa is increased and thus the mesa is inclined to crack.

From this viewpoint, if, in the MZ modulator, the above-described bank-shaped ridge protection layer made of a semiconductor material is provided at both sides of the optical waveguide, in this case, there is a problem that the parasitic capacitance of an electrode pad, which is necessary to bond a wire to an upper electrode of the MZ modulator, is increased, and thereby it is not possible to handle a high speed operation.

Specifically, in the MZ modulator, an electrode pad and a lead wire from an upper electrode of a modulation waveguide portion to the electrode pad are required to bond a wire to the upper electrode of the modulation waveguide portion. In this case, generally, an electrode pad with the size of about 100 µmφ is necessary for the wire bonding. Therefore, for example, if such an electrode pad is formed on the ridge protection layer which is the above-described bank-shaped semiconductor material in the MZ modulator, the parasitic capacitance of the electrode pad is increased, and thereby it is not possible to handle a high speed operation.

In light of the problems described above, an object of the present invention is to provide an optical device for improving the yield in a manufacturing process of the high mesa optical waveguide and reducing the parasitic capacitance of the electrode pad.

(1) According to an aspect of the invention, an optical device includes a ridge-like optical waveguide portion, a mesa protector portion that is arranged in parallel to the optical waveguide portion, a resin portion that covers upper parts of the mesa protector portion and is disposed at both sides of the mesa protector portion, an electrode that is disposed on the optical waveguide portion, an electrode pad that is disposed on the resin portion located at an opposite side to the optical waveguide portion with respect to the mesa protector portion, and a connection portion that is disposed on the resin portion and electrically connects the electrode to the electrode pad.

(2) In the optical device of (1), a height of the mesa protector portion is greater than a height of the optical waveguide portion.

(3) In the optical device of (1), a height of the mesa protector portion is substantially the same as a height of the optical waveguide portion.

(4) In the optical device of (1), a width of the mesa protector portion is substantially the same as a height of the optical waveguide portion (5) In the optical device of (1), the mesa protector portion includes a pair of mesa protectors disposed at both sides of the optical waveguide portion.

(6) In the optical device of (1), the optical waveguide portion includes a first optical waveguide that guides incident light, a first branch portion that branches the light guided by the first optical waveguide, a plurality of modulation waveguides that modulate and guide the branched light, a second branch portion that combines the light from the plurality of modulation waveguides; and a second optical waveguide that guides the light from the second branch portion.

(7) According to another aspect of the invention, a modulator module includes an optical device. The optical device includes a ridge-like optical waveguide portion, a mesa protector portion that is arranged in parallel to the optical waveguide portion, a resin portion that covers upper parts of the mesa protector portion and is disposed at both sides of the mesa protector portion, an electrode that is disposed on the optical waveguide portion, an electrode pad that is disposed on the resin portion located at an opposite side to the optical waveguide portion with respect to the mesa protector portion, and a connection portion that is disposed on the resin portion and electrically connects the electrode to the electrode pad.

(8) In the modulator module of (7), the modulator module further includes a semiconductor laser that outputs light to the optical device. The optical device and the semiconductor laser are provided so as to be integrated into the same substrate.

(9) According to another aspect of the invention, a manufacturing method of an optical device includes laminating at least a first clad layer, an active layer, and a second clad layer on a substrate so as to form a laminate structure, etching the laminate structure so as to form a ridge-like optical waveguide portion and a mesa protector portion arranged in parallel to the optical waveguide portion, forming a passivation layer on the etched laminate structure and forming a resin portion on the passivation layer, and forming an electrode portion extending from an upper part of the optical waveguide portion to an upper part of the resin portion located at an opposite side to the optical waveguide portion with respect to the mesa protector portion.

DETAILED DESCRIPTION OF THE INVENTION

Figure 1:
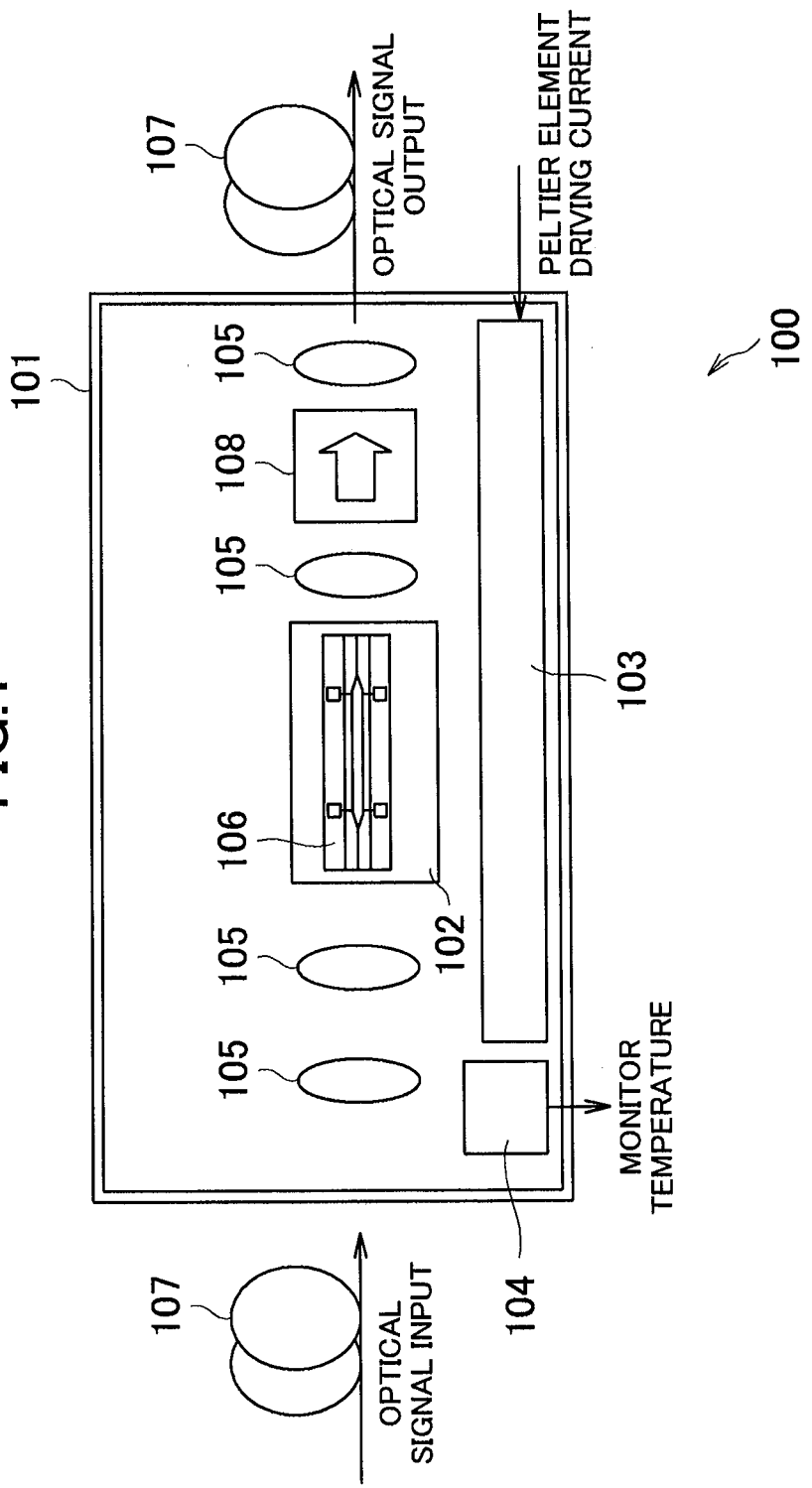
FIG. 1 is a diagram illustrating an overall configuration of the modulator module according to a first embodiment of the present invention.

Hereinafter, embodiments of the present invention will be described with reference to the drawings. In addition, in the drawings, the same or equivalent elements are given the same reference numerals, and repeated description will be omitted.

First Embodiment

FIG. 1 is a diagram illustrating an overall configuration of the modulator module according to a first embodiment of the present invention.

As shown in FIG. 1, the modulator module 100 includes a carrier 102, a Peltier element 103 adjusting temperature, a thermistor 104 detecting temperature, and a plurality of condensing lenses 105 in a package 101. A termination resistor (not shown) is added to the carrier 102, and a semiconductor MZ modulator 106 is mounted thereon. In addition, the package 101 has a box form obtained by processing a metallic material, and includes, for example, a bottom plate of a CuW alloy having high thermal conductivity, a frame of a FeNi alloy, a ceramic feedthrough where a wire pattern is formed so as to transmit an electric signal to the inside of the package 101, a lead terminal, a seam ring for seam welding of a cap, a sapphire glass for air-tight sealing of a window for extracting light, a pipe member for fixing a lens holder or an optical fiber by welding, and the like.

The thermistor 104 detects the temperature of the semiconductor MZ modulator 106 and outputs the detected temperature to a controller (not shown) as a monitor temperature signal. The controller outputs a Peltier element driving current signal to the Peltier element 103 in response to the monitor temperature signal. Thereby, temperature of the semiconductor MZ modulator 106 is kept constant.

In addition, an optical signal input via an optical fiber 107 is input to the semiconductor MZ modulator 106 via the condensing lenses 105 and is modulated in the semiconductor MZ modulator 106 in response to a modulation driving signal input from an external device. The modulated optical signal is output to the output side optical fiber 107 via the condensing lens 105, a light isolator 108 and the condensing lens 105 in this order. In addition, the configuration of the modulator module 100 shown in FIG. 1 is an example, and the modulator module 100 according to the present embodiment is not limited thereto.

Figure 2:
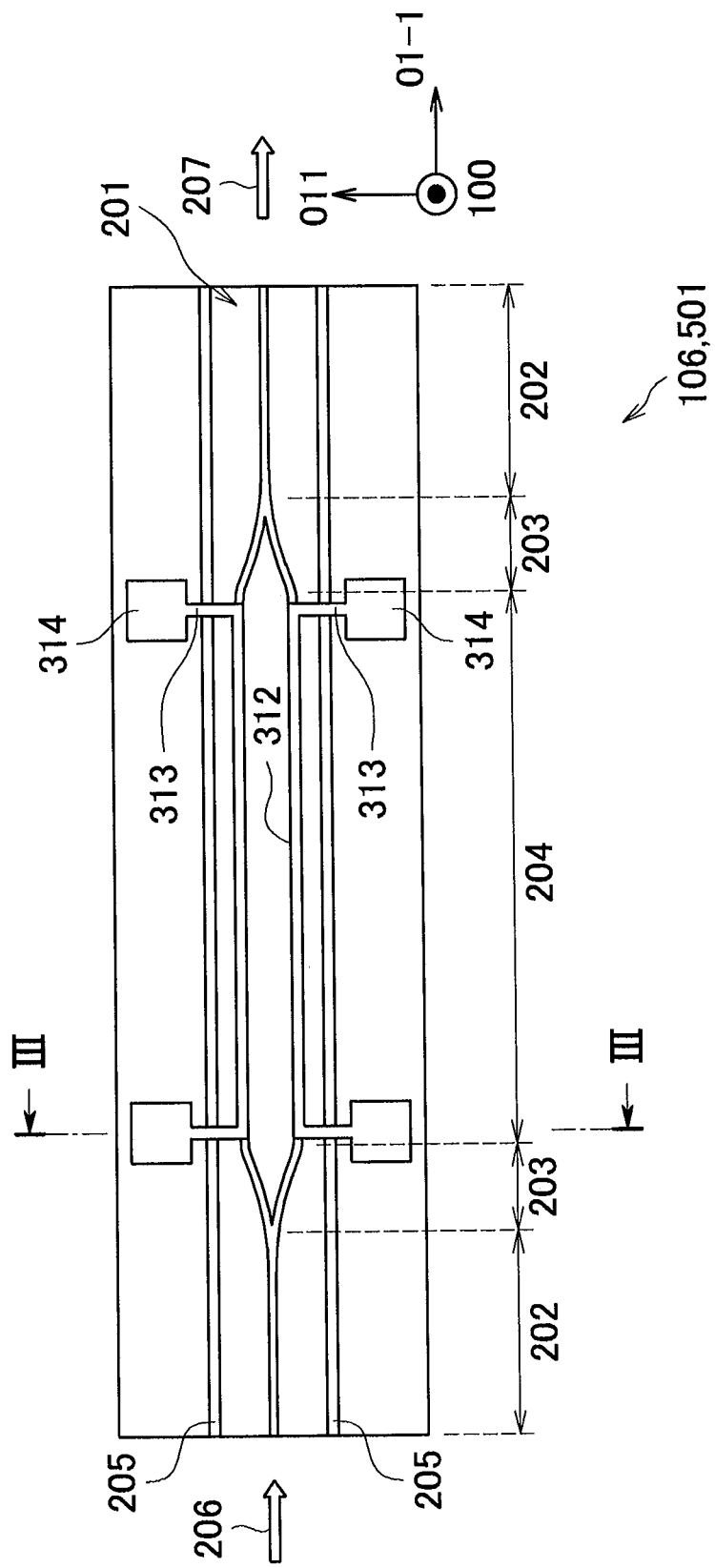
FIG. 2 is a top view of the semiconductor MZ modulator shown in FIG. 1.
Figure 3:
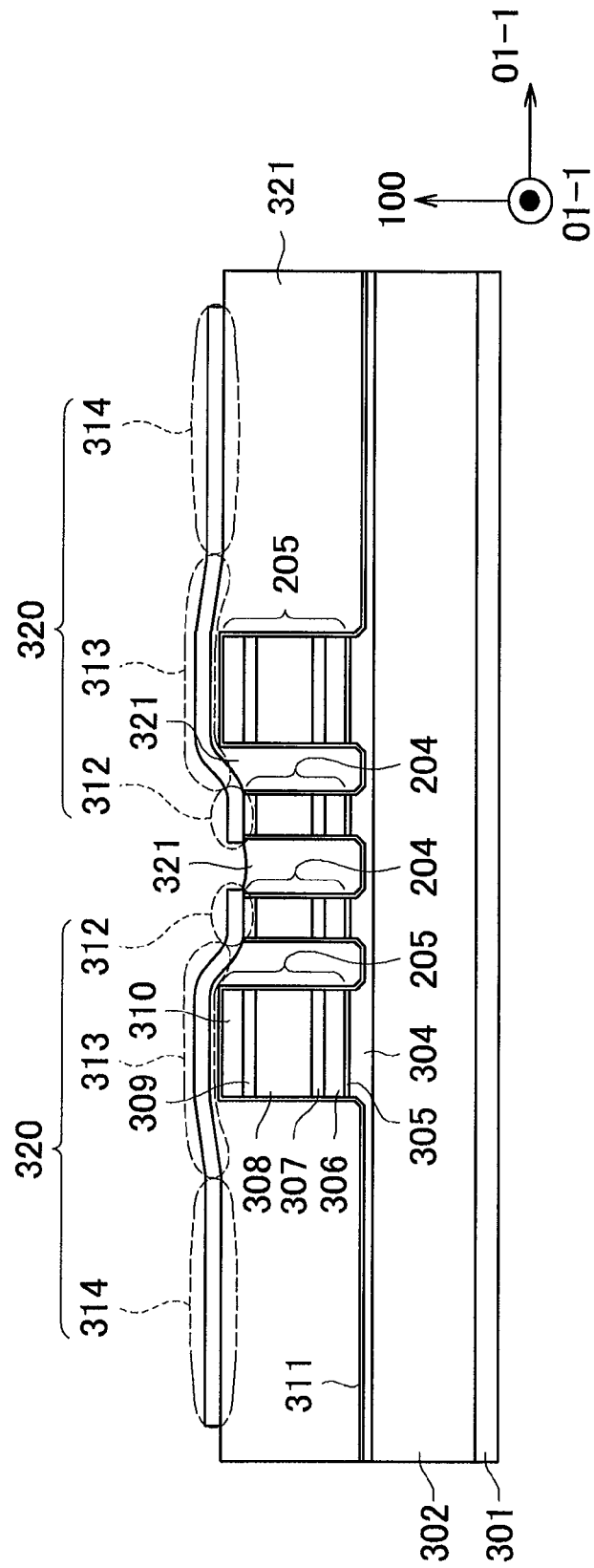
FIG. 3 is a cross-sectional view taken along the line in FIG. 2.

FIG. 2 is a top view of the semiconductor MZ modulator shown in FIG. 1. In addition, FIG. 3 is a cross-sectional view taken along the line III-III in FIG. 2.

As shown in FIG. 2, the semiconductor MZ modulator 106 has an optical waveguide portion 201 which substantially crosses the center thereof. The optical waveguide portion 201 includes an optical waveguide 202, a Y branch 203, two modulation waveguides 204, a Y branch 203, and an optical waveguide 202 in this order from the direction where light is incident (incidence direction). Specifically, the optical waveguide 202 is divided into the two modulation waveguides 204 in the Y branch 203 and is then combined into the single optical waveguide 202 in the subsequent Y branch 203 in this order from the incidence direction. In addition, the optical waveguide 202 has a so-called high mesa structure, and is formed in the 01-1 direction which is a forward mesa direction. Further, in the figure, the 011 direction indicates a reverse mesa direction, and the 100 direction indicates a direction perpendicular to the forward mesa direction and the reverse mesa direction.

In addition, the semiconductor MZ modulator 106 includes mesa protectors 205 at both sides of the optical waveguide portion 201 along the optical waveguide portion 201. Specifically, the mesa protectors 205 are disposed at a predetermined distance from the optical waveguide 202 at both sides of the optical waveguide 202. In other words, a gap between the mesa protectors 205 and the optical waveguide 202 is formed to be larger than a gap between the optical waveguide 202 and the modulation waveguide 204 of the two modulation waveguides 204 which are located at a side of the mesa protector 205.

Moreover, the semiconductor MZ modulator 106 includes electrodes 312 on the modulation waveguides 204 along the modulation waveguides 204. In addition, the respective ends of the electrodes 312 are connected to electrode pads 314 via lead wires 313. Specifically, the lead wire 313 passes on the mesa protector 205 from the electrode 312 and is then connected to the electrode pad 314. A voltage is applied to each modulation waveguide via the two electrode pads 314 and the electrode 312, and, thus, it is possible to handle a high speed operation more efficiently. In addition, although a configuration where four electrode pads 314 are disposed is employed in FIG. 2, one or more embodiments of the present invention is not limited thereto, a different number of electrode pads 314 may be used, and a shape of the electrode 312 may be different. In addition, a positional relationship between the electrodes 312, the mesa protectors 205, the modulation waveguides 204, and the like will be described later in detail.

Next, a cross-sectional structure of the semiconductor MZ modulator will be described with reference to FIG. 3. An n side electrode 301 and an n type InP substrate 302 (substrate) are disposed in this order from the lower side of FIG. 3.

The modulation waveguide 204 includes an n type InP clad layer 304, an InGaAsP lower side light guide layer 305, a quantum well active layer 306 (active layer), an InGaAsP upper side light guide layer 307, a p type InP clad layer 308, and a p type contact layer 309 formed of a p type InGaAsP layer and a p type InGaAsP layer in this order on the laminate structure. In addition, the optical waveguide 202 also has the same cross-sectional structure and thus description thereof will be omitted.

The mesa protector 205 also includes an n type InP clad layer 304, an InGaAsP lower side light guide layer 305, a quantum well active layer 306, an InGaAsP upper side light guide layer 307, a p type InP clad layer 308, and a p type contact layer 309 formed of a p type InGaAsP layer and a p type InGaAsP layer in this order on the laminate structure. In addition, a p type InP cap layer 310 is further provided.

Further, a passivation layer 311 covers side surfaces of the modulation waveguides 204, upper surfaces and side surfaces of the mesa protectors 205, and portions where there are no modulation waveguides 204 or mesa protectors 205 (between the two modulation waveguide 204 portions, between the optical waveguide 202 and the mesa protectors 205, between the modulation waveguides 204 and the mesa protectors 205, and outsides of the mesa protectors 205).

In addition, an upper part of the passivation layer 311 is covered by a resin 321 except for the upper parts of the modulation waveguides 204. In other words, via the passivation layer 311, the resin 321 covers the portions, where there are no modulation waveguides 204 or mesa protectors 205 (between the two modulation waveguides 204 portions, between the optical waveguide 202 and the mesa protectors 205, between the modulation waveguides 204 and the mesa protectors 205, and outsides of the mesa protectors 205) and upper parts of the mesa protectors 205.

In addition, the p side electrodes 312 of p side electrode layers 320 covers the upper surfaces of the modulation waveguides 204, that is, the upper surfaces of the p type contact layers 309 of the modulation waveguides 204. Further, the p side electrode 312 is connected to the electrode pad 314 via the lead wire 313. Here, the p side electrode 312, the lead wire 313, and the electrode pad 314 form the p side electrode layer 320 together. In other words, the p side electrode layer 320 extends on the resin 321 from the upper surface of the p type contact layer 309 of the modulation waveguide 204 and is disposed to extend to the resin 321 located at a side opposite to the modulation waveguide 204 with respect to the mesa protector 205.

Here, as shown in FIG. 3, the mesa protectors 205 have approximately the same height to width ratio. Thereby, the intensity of the mesa protectors 205 can be made equal to or greater than a desired intensity. In addition, for example, the height and the width of each of the mesa protectors 205 may be about 4 to 5 μm. The mesa protector 205 is higher than the optical waveguide 202. Thereby, it is possible to efficiently prevent cracking of the optical waveguide portion 201 (mesa cracking) in a manufacturing process.

Next, an outline of an operation of the semiconductor MZ modulator 106 will be described. Incident light 206 incident to the optical waveguide 202 is branched out to the two modulation waveguides 204 by the Y branch 203 at a ratio of approximately one to one and is guided. The light beams guided by the two modulation waveguides 204 are combined by the Y branch 203 and are then guided. At this time, when a voltage is applied between the p type electrodes 312 formed on the modulation waveguides 204 and the n side electrode 301 formed on the substrate 302 side, a refractive index or absorptivity of the active layer 306 of the modulation waveguide 204 is varied, and thereby the incident light 206 is modulated. Thereby, an amount of the light beams combined and guided by the Y branch 203 is varied by phases or intensities of the respective light beams guided by the two modulation waveguides 204. As described above, by applying a voltage between the p side electrodes 312 and the n side electrode 301, it is possible to vary a light intensity of emitted light 207.

In addition, the configuration and the operation of the semiconductor MZ modulator are an example, and one or more embodiments of the present invention is not limited thereto. For example, although the configuration including two modulation waveguides 204 and operation have been described in the above description, other numbers thereof may be used. In addition, in this case, a branch portion for branching out the optical waveguide 202 in a plurality may be used instead of the Y branch 203.

Next, a manufacturing method of the semiconductor MZ modulator 106 according to the present embodiment will be described.

First, as a crystal growth of the modulation waveguide 204, according to a well-known crystal growth method using an organic metal vapor method, the n type InP clad layer 304, the InGaAsP lower side light guide layer 305, the active layer 306 formed of an undoped strain multiquantum well layer including an InGaAsP well layer and a barrier layer, and the InP cap layer are grown on the n type InP substrate 302. In addition, a SiN film is formed through a plasma CVD, then the SiN film is patterned in a region which will become the modulation waveguide 204, and a multi-layer structure corresponding to the modulation waveguide 204 is removed in regions other than the region which will become the modulation waveguide 204 through dry etching and wet etching using the SiN film as a mask.

Next, as a second crystal growth, in regions other than the region where the modulation waveguide 204 is formed, as multi-layer growth of the passive optical waveguide 202 (optical waveguide) and the Y branch 203, the InGaAsP lower side light guide layer 305, the quantum well active layer 306 formed of an InGaAsP well layer and a barrier layer, the InGaAsP upper side light guide layer 307, and the InP cap layer are sequentially formed using an organic metal vapor method. At this time, the Y branch 203 is optically connected to the modulation waveguide 204.

Figure 4:
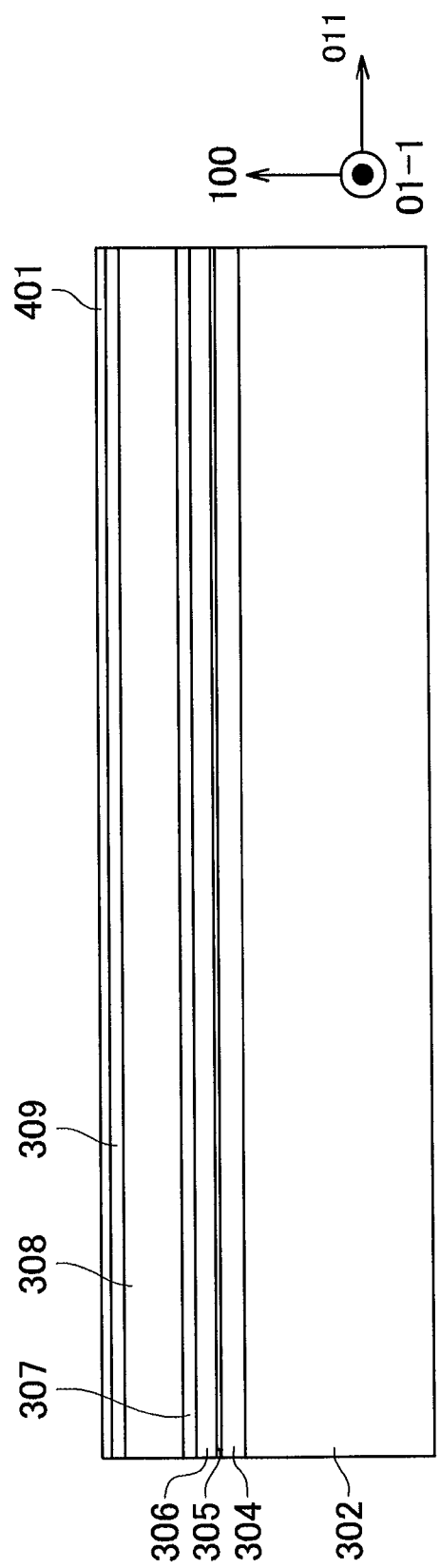
FIG. 4 is a diagram illustrating a manufacturing process of the modulator according to the first embodiment of the present invention.

Next, as shown in FIG. 4, as a third crystal growth, the p type InP clad layer 308 which is an upper clad layer, the p type contact layer 309 formed of a p type InGaAsP layer and a p type InGaAs layer, and a p type InP cap layer 401 are formed on the modulation waveguide 204, the Y branch 203, and the passive optical waveguide 202. In addition, the p type InP cap layer is removed in an intermediate process and thus is not left in a final structure. Here, a p type dopant uses, for example, Zn.

Figure 5:
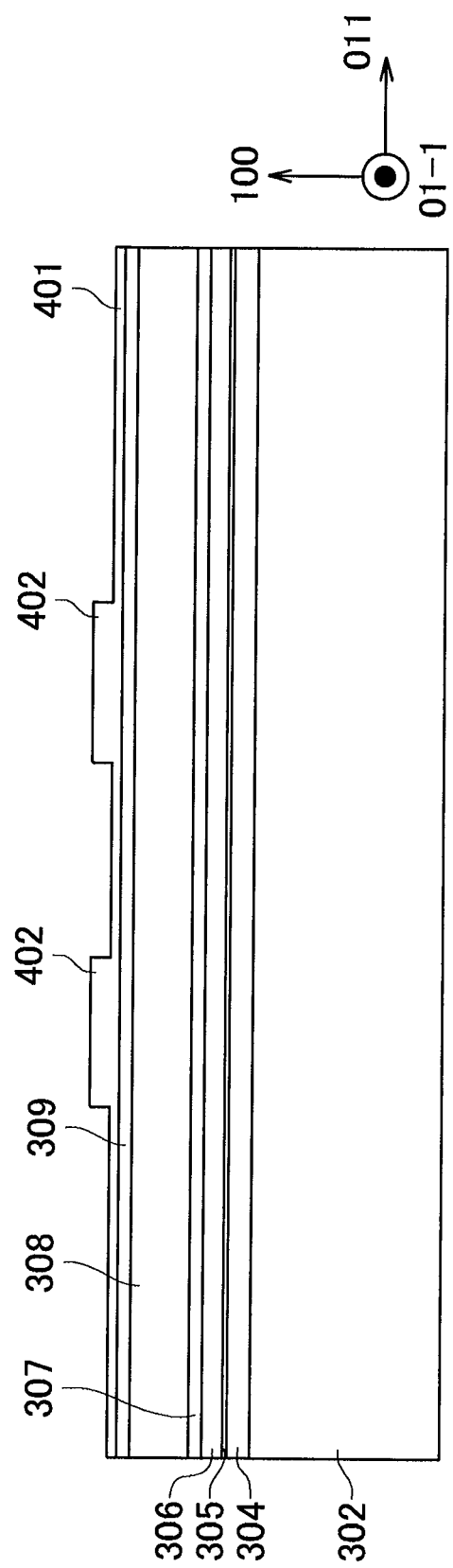
FIG. 5 is a diagram illustrating a manufacturing process of the modulator according to the first embodiment of the present invention.

Next, as shown in FIG. 5, an InP layer 402 is regrown through the well-known selective growth method at a portion where the mesa protector 205 will be formed in a subsequent process. In addition, the p type InP cap layer 310 of the mesa protector 205 is formed based on the InP layer 402.

Figure 6:
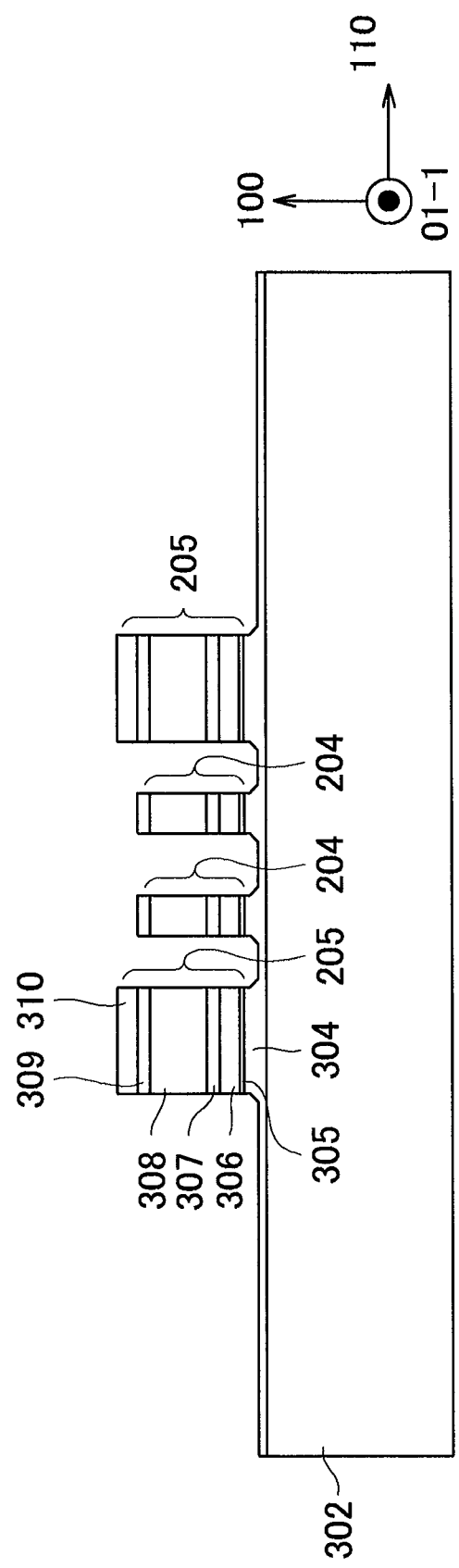
FIG. 6 is a diagram illustrating a manufacturing process of the modulator according to the first embodiment of the present invention.

Thereafter, as shown in FIG. 6, a high mesa optical waveguide with a height of, for example, about 4 μm is formed through dry etching and wet etching over the passive optical waveguide 202 from the modulation waveguide 204. In addition, at this time, the mesa protector 205 is also formed. Further, preferably, the width of the mesa protector 205 is not too large such that the mesa protector 205 is not disposed under the electrode pad 314, and is substantially the same as the height of the mesa, for example, about 5 μm such that a mechanical intensity thereof is maintained.

Figure 7:
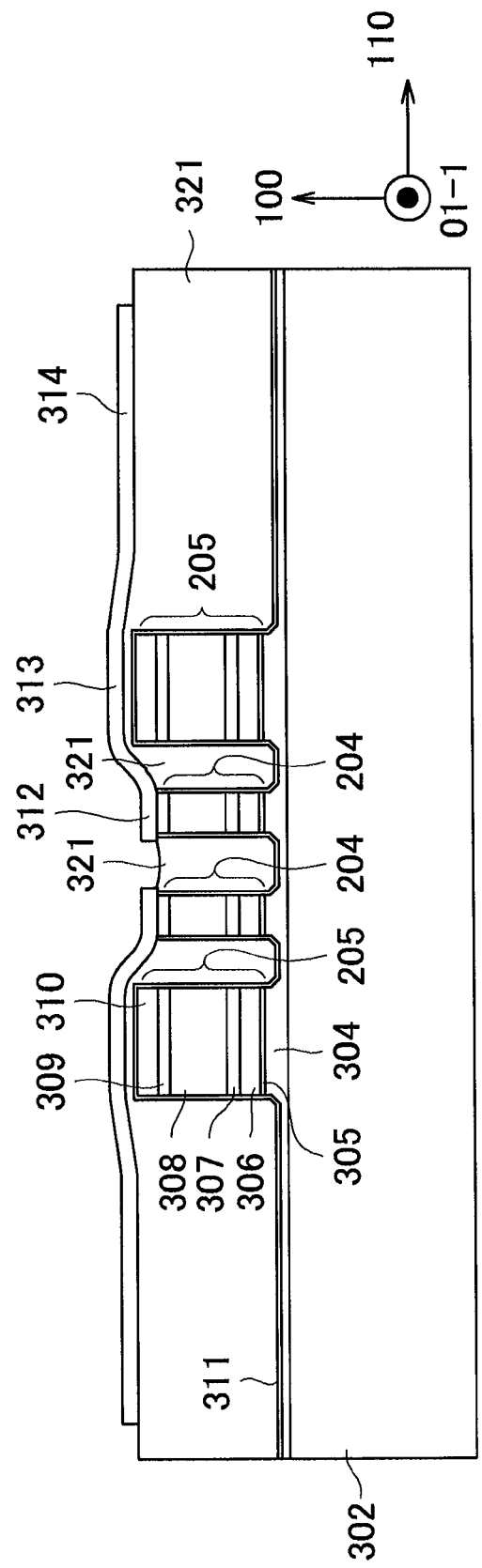
FIG. 7 is a diagram illustrating a manufacturing process of the modulator according to the first embodiment of the present invention.

Next, as shown in FIG. 7, the passivation layer 311 is formed on the laminate structure shown in FIG. 6 through the well-known plasma CVD, and the resin 321 is coated on the passivation layer 311. In addition, an electrode hole is formed at the modulation waveguide 204 portion through etchback and through-hole processes. Further, the p side electrode 312, the lead wire 313, and the electrode pad 314 are formed using an EB (Electron Beam) deposition method and a photolithography technique. The resin 321 may use, for example, polyimide, tetraethoxysilane, or benzocyclobutene.

Next, the substrate 302 is polished up to, for example, about 150 μm in a rear surface polishing process so as to form the n side electrode 301, and then a wafer process is completed through an electrode alloy process. Finally, a chip is formed for each semiconductor MZ modulator from the wafer and undergoes end surface coating, thereby acquiring the semiconductor MZ modulator 106 shown in FIG. 3.

According to the present embodiment, the upper surface of the high mesa optical waveguide (the optical waveguide portion 201) is lower than the upper surface of the mesa protector 205. Therefore, in the manufacturing process, since the high mesa optical waveguide is protected from mechanical contact, mesa cracking is reduced, and thus the semiconductor MZ modulator 106, the modulator module 100 having the semiconductor MZ modulator 106, and the like can be stably produced at a high yield. Further, by forming the low dielectric resin 321 under the electrode pad 314 instead of the semiconductor, it is possible to achieve low capacitance, and thus a high speed operation of, for example, 10 Gbit/s is possible.

Second Embodiment

Next, a second embodiment of the present invention will be described. In addition, in the following, description of the same parts as in the first embodiment will be omitted.

Figure 8:
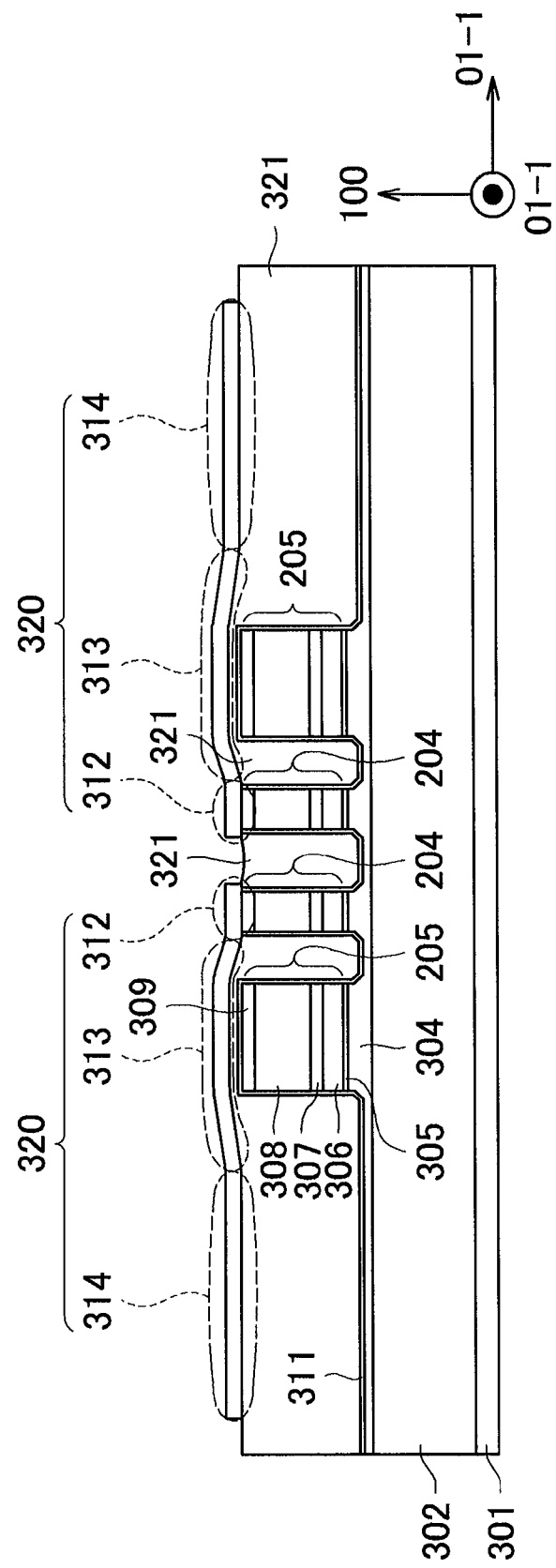
FIG. 8 is a cross-sectional view of a semiconductor MZ modulator according to a second embodiment of the present invention.

FIG. 8 is a diagram illustrating a modulator module according to the present embodiment. Specifically, FIG. 8 is a cross-sectional view of the semiconductor MZ modulator 501 according to the present embodiment, taken along the line in FIG. 2. As shown in FIG. 8, the present embodiment is mainly different from the first embodiment in that the height of the mesa protector 205 is substantially the same as the height of the optical waveguide 202. Specifically, in the present embodiment, since the p type InP cap layer 310 is not disposed on the p type contact layer 309, the height of the mesa protector 205 is substantially the same as the height of the optical waveguide 202. The other configurations are the same as those in the first embodiment, and thus descriptions thereof will be omitted.

Next, a manufacturing method of the semiconductor MZ modulator 501 according to the present embodiment will be described. The present embodiment is mainly different from the first embodiment in that the InP layer 402 is not regrown by growing the p type InP cap layer 401 after performing the third crystal growth in the first embodiment. Hereinafter, a detailed description thereof will be made.

Figure 9:
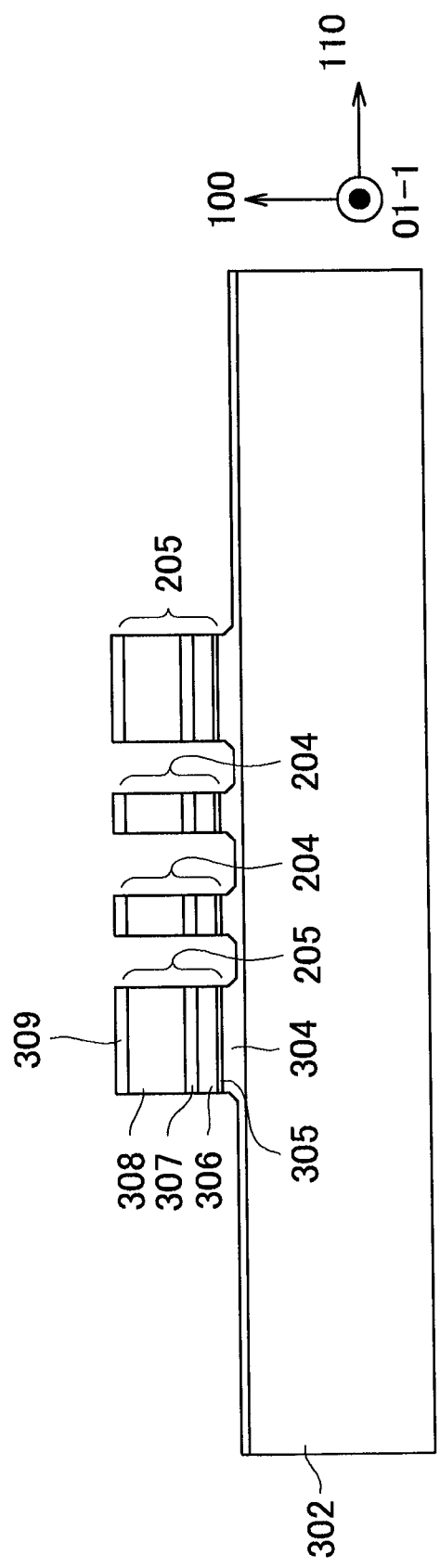
FIG. 9 is a diagram illustrating a manufacturing process of the modulator according to the second embodiment of the present invention.

The same manufacturing process as in the first embodiment is performed up to the third crystal growth. Then, as shown in FIG. 9, the modulation waveguide 204 and the mesa protector 205 are formed through two-step etching of dry etching and wet etching in the same manner as the first embodiment without regrowig the p type InP cap layer 401.

Figure 10:
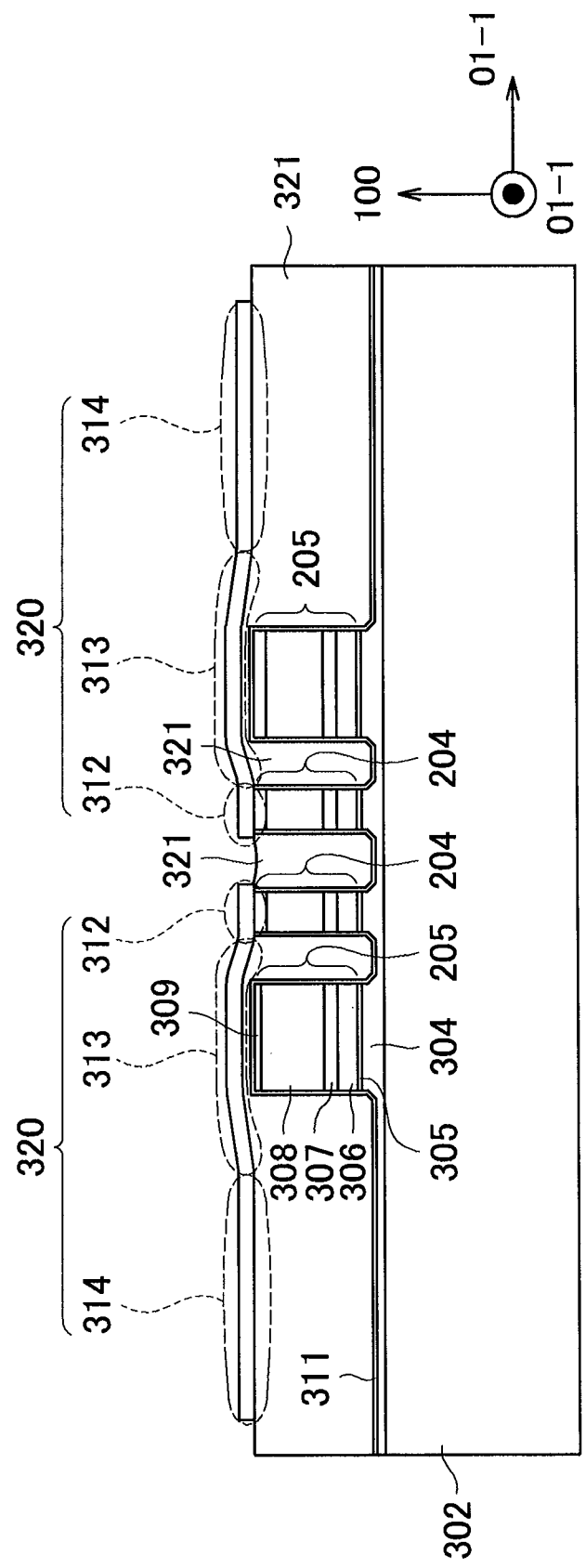
FIG. 10 is a diagram illustrating a manufacturing process of the modulator according to the second embodiment of the present invention.

Thereafter, as shown in FIG. 10, in the same manner as the first embodiment, the passivation layer 311 is formed through the plasma CVD, and the resin 321 is coated thereon. In addition, an electrode hole is formed at the modulation waveguide 204 portion through etchback and through-hole processes. Further, the p side electrode 312, the lead wire 313, and the electrode pad 314 are formed using an EB (Electron Beam) deposition method and a photolithography technique.

Next, the n type InP substrate 302 is polished up to about 150 μm in a rear surface polishing process so as to form the n side electrode 301. Then, a wafer process is completed through an electrode alloy process. Finally, a chip is formed for each semiconductor MZ modulator 501 from the wafer and undergoes end surface coating, thereby acquiring the semiconductor MZ modulator 501 shown in FIG. 8.

According to the present embodiment, as compared with the first embodiment, since the mesa protector 205 and the optical waveguide portion 201 can be formed together without separately regrowing the InP layer 402 as shown in FIG. 5, the semiconductor MZ modulator 501 can be acquired without increasing the number of manufacturing processes. In addition, since the high mesa optical waveguide (the optical waveguide portion 201) has substantially the same height as the mesa protector 205, the high mesa optical waveguide is protected from mechanical contact. Therefore, since the high mesa optical waveguide is protected from mechanical contact, mesa cracking is reduced, and thus the semiconductor MZ modulator 501, a modulator module having the semiconductor MZ modulator 501, and the like can be stably produced at a high yield. Further, by forming the low dielectric resin 321 under the electrode pad 314 instead of the semiconductor, it is possible to achieve low capacitance, and thus a high speed operation of 10 Gbit/s is possible.

In addition, the present invention is not limited to the first and second embodiments, and may be replaced with a configuration which is substantially the same as the configuration shown in the embodiments, a configuration achieving the same operations and effects, or a configuration capable of achieving the same object.

For example, the semiconductor MZ modulator 106 or 501 according to the first embodiment or the second embodiment may be applied to a laser module (wavelength variable laser module) which can adjust an input wavelength. The semiconductor MZ modulator 106 or 501 is a modulator having smaller wavelength dependency than a semiconductor electro-absorption modulator, and thus can be used in a wavelength variable laser module.

Figure 11:
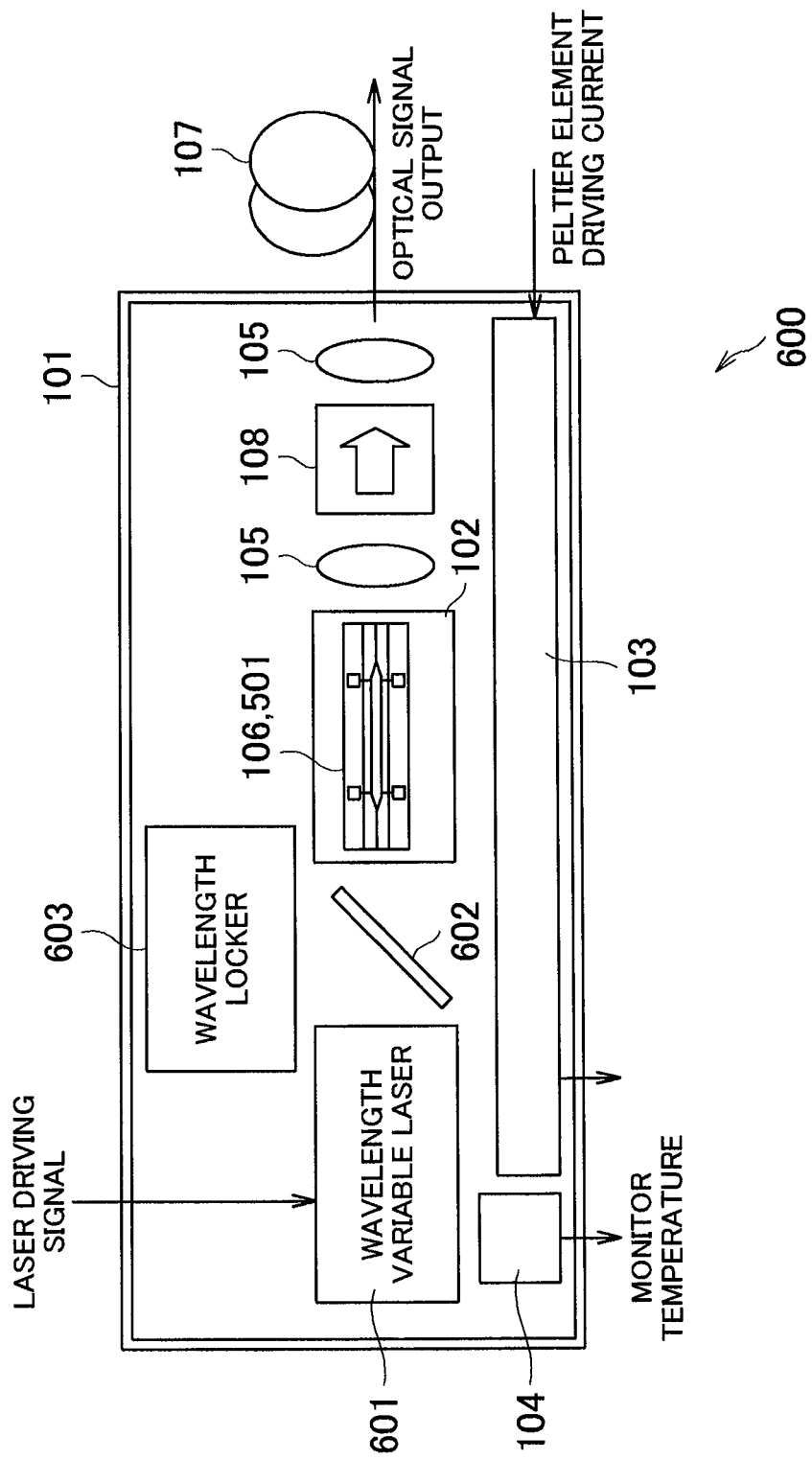
FIG. 11 is a diagram illustrating an example where the modulator according to the first or second embodiment of the present invention is applied to a wavelength variable laser module.

An example of this case is shown in FIG. 11. As shown in FIG. 11, a wavelength variable laser module 600 includes a wavelength variable laser 601, a half mirror 602, and a wavelength locker 603 on the input side of the semiconductor MZ modulator 106 or 501. The wavelength variable laser 601 emits light of a wavelength corresponding to a laser driving signal, and the emitted light is incident to the wavelength locker 603 and the semiconductor MZ modulator 106 or 501 via the half mirror 602. The wavelength locker 603 measures light output from the wavelength variable laser 601 and adjusts a wavelength of the wavelength variable laser 601 depending on a wavelength of the measured light. In this case, if the semiconductor MZ modulator 106 or 501 have low wavelength dependency, it is possible to perform a high speed operation of, for example, 10 Gbit/s in a wavelength range of 1528 to 1568 nm which is a C band. In addition, other configurations are the same as the configurations of the modulator module 100 shown in FIG. 1, and thus description thereof will be omitted.

Third Embodiment

Next, a third embodiment of the present invention will be described. In addition, in the following, description of the same parts as in the first embodiment or the second embodiment will be omitted.

Figure 12:
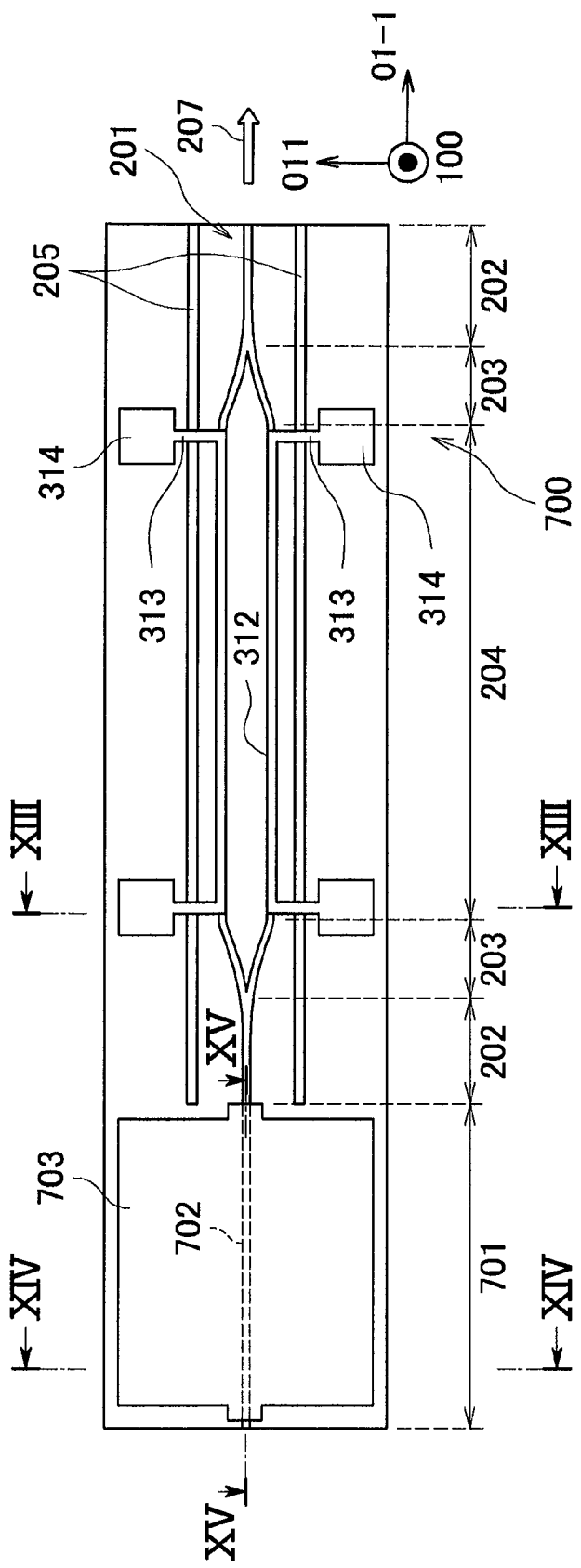
FIG. 12 is a diagram illustrating a modulator module according to a third embodiment of the present invention.
Figure 13:
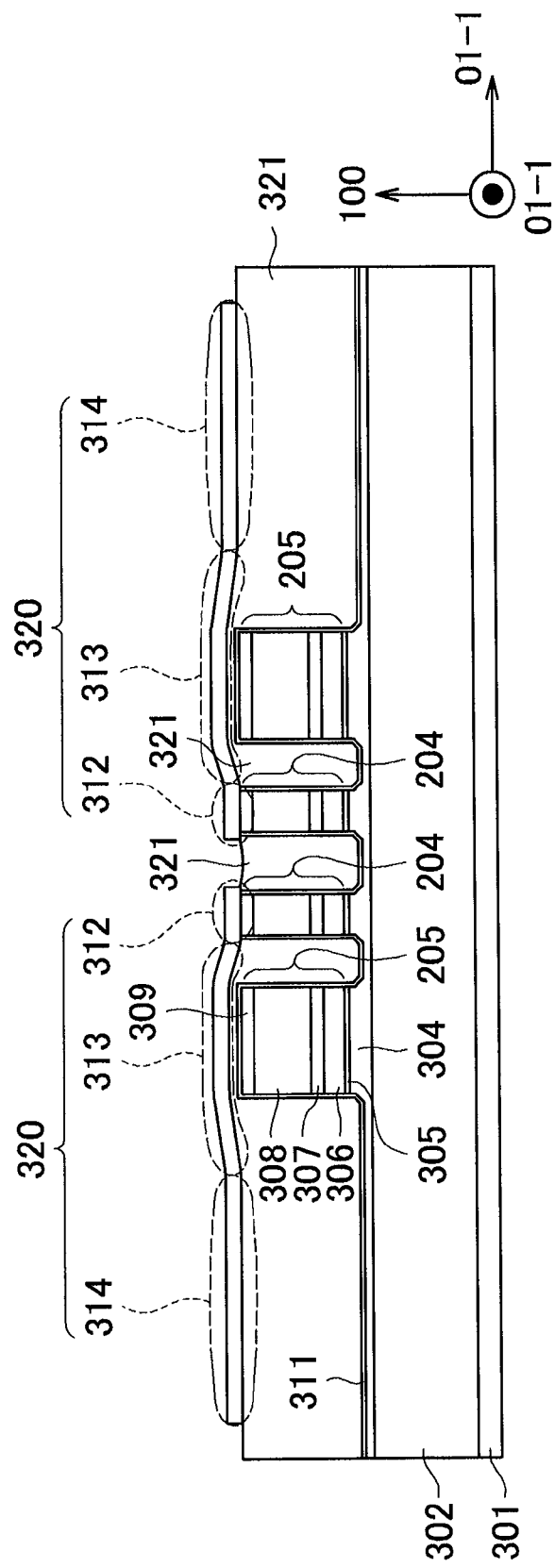
FIG. 13 is a cross-sectional view taken along the line XIII-XIII in FIG. 12.
Figure 14:
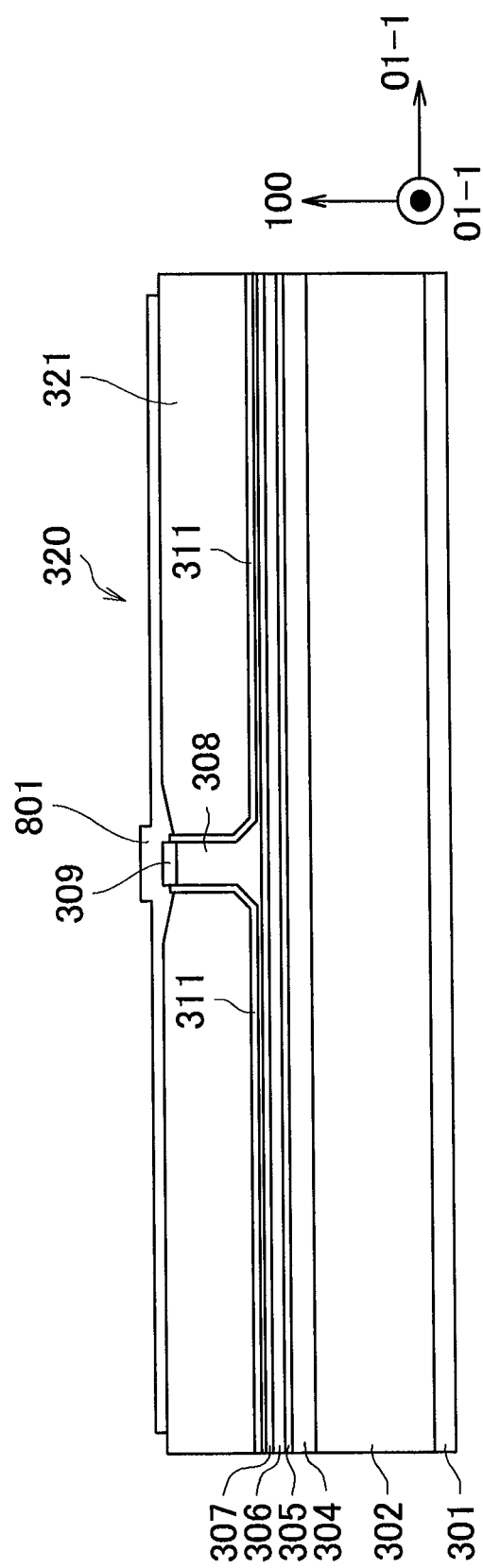
FIG. 14 is a cross-sectional view taken along the line XIV-XIV in FIG. 12.
Figure 15:
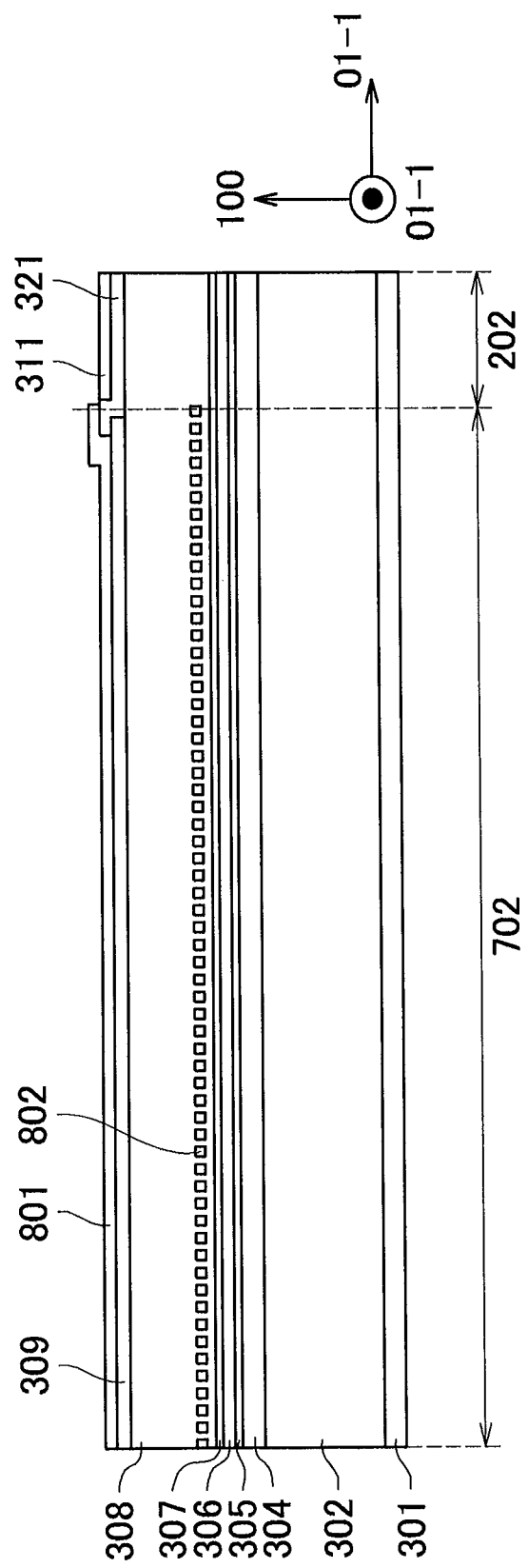
FIG. 15 is a cross-sectional view taken along the line XV-XV in FIG. 12.

FIG. 12 is a top view illustrating a configuration of a DFB laser integrated semiconductor MZ modulator according to the present invention. FIG. 13 is a cross-sectional view taken along the line XIII-XIII in FIG. 12. FIG. 14 is a cross-sectional view taken along the line XIV-XIV in FIG. 12. FIG. 15 is a cross-sectional view taken along the line XV-XV in FIG. 12.

As shown in FIGS. 12 to 15, the DFB laser integrated semiconductor MZ modulator 700 according to the present embodiment is mainly different from the semiconductor MZ modulator 501 according to the first embodiment or the second embodiment in that a DFB laser 703 is integrated into the semiconductor MZ modulator 106 or 501 according to the first embodiment or the second embodiment. In addition, in the following, a case where the DFB laser 703 is integrated into, for example, the semiconductor MZ modulator 501 according to the second embodiment will be described as an example.

As shown in FIG. 12, the DFB laser integrated semiconductor MZ modulator 700 includes a DFB laser portion 701, an optical waveguide 202, a Y branch 203, two modulation waveguides 204, a Y branch 203, and an optical waveguide 202. In the same manner as the first embodiment, the optical waveguide portion 201 includes the optical waveguide 202, the Y branch 203, the two modulation waveguides 204, the Y branch 203, and the optical waveguide 202 in this order from the direction where light is incident (incidence direction). Further, the optical waveguide 702 of the DFB laser portion 701 has a low mesa structure, and the optical waveguide 202 other than the DFB laser portion 701 has a high mesa structure. In addition, as described above, although the example where the low mesa ridge DFB laser 703 having high reliability in the related art is used as the DFB laser portion 701 has been described in the present embodiment, a high mesa DFB laser may be used as the DFB laser portion 701.

In addition, in the same manner as the second embodiment, the DFB laser integrated semiconductor MZ modulator 700 has mesa protectors 205 along the optical waveguide portion 201 including the optical waveguide 202, the Y branch 203, and the two modulation waveguides 204. Specifically, two mesa protectors 205 arranged in parallel are disposed at both sides of the optical waveguide portion 201. In addition, although a case where the mesa protectors 205 are disposed only at both sides of the optical waveguide portion 201 has been described in FIG. 12, the mesa protectors 205 may extend at both sides of an optical waveguide 702.

Next, a cross-sectional structure of the DFB laser integrated semiconductor MZ modulator will be described. In addition, in the following, as shown in FIG. 13, a cross-sectional structure of the portions other than the DFB laser portion 701 is the same as that in the second embodiment, and thus description thereof will be omitted.

As shown in FIG. 14, when viewed from the cross-section taken along the line XIV-XIV in FIG. 12, an n side electrode 301 and an n type InP substrate 302 (substrate) are disposed in this order from the lower side of FIG. 14.

In addition, in the region where the optical waveguide 702 of the DFB laser portion 701 is formed, an n type InP clad layer 304, an InGaAsP lower side light guide layer 305, a quantum well active layer 306 (active layer), an InGaAsP upper side light guide layer 307, a p type InP clad layer 308, a p type contact layer 309 formed of a p type InGaAsP layer and a p type InGaAsP layer, and a p side electrode layer 320 which will become a p type electrode 801 of the DFB laser portion 701 are formed in this order on the laminate structure.

Further, side surfaces of the region where the optical waveguide 702 of the DFB laser portion 701 is formed and portions other than the region are covered by a passivation layer 311. The upper part of the passivation layer 311 is covered by a resin 321 except for the upper part of the region where the optical waveguide 702 of the DFB laser portion 701 is formed, and the p side electrode layer 320 is further disposed on the resin 321.

In addition, as shown in FIG. 15, when viewed from the cross-section taken along the line XV-XV in FIG. 12, the n side electrode 301 and the n type InP substrate 302 (substrate) are disposed in this order from the lower side of FIG. 15. Further, the n type InP clad layer 304, the InGaAsP lower side light guide layer 305, the quantum well active layer 306 (active layer), the InGaAsP upper side light guide layer 307, the p type InP clad layer 308, the p type contact layer 309 formed of a p type InGaAsP layer and a p type InGaAsP layer, and the p side electrode layer 320 which will become a p type electrode 801 of the DFB laser portion 701 are disposed in this order. In addition, here, a diffraction grating layer 802 described later is formed in the p type InP clad layer 308.

Next, an outline of an operation of the DFB laser integrated semiconductor MZ modulator 700 will be described. By injecting a current between the p type electrode 801 formed at the upper part of the DFB laser portion 701 and the n side electrode 301 formed on the substrate 302 side, laser light oscillates from the DFB laser portion 701 in a single longitudinal mode. In addition, in the same manner as the first embodiment or the second embodiment, the laser light (incident light) which is incident to the optical waveguide 202 is branched out to the two modulation waveguides 204 by the Y branch 203 at a ratio of one to one and is guided. The light beams guided by the two modulation waveguides 204 are combined by the Y branch 203 and are then guided. At this time, when a voltage is applied between the p type electrodes 312 formed on the modulation waveguides 204 and the n side electrode 301 formed on the substrate 302 side, a refractive index or absorptivity of the active layer 306 of the modulation waveguide 204 is varied, and thereby the incident light is modulated.

As such, upon comparison with the case of using the semiconductor MZ modulator 106 or 501 according to the first embodiment or the second embodiment, the DFB laser integrated semiconductor MZ modulator 700 can be easily used as an optical communication light source because a modulation characteristic can be obtained without inputting light (for example, the incident light 206) to the DFB laser integrated semiconductor MZ modulator 700 from outside. Although, in the present embodiment, the configuration where the DFB laser portion 701 is integrated into the semiconductor MZ modulator 501 has been described, a wavelength variable light source, a semiconductor amplifier, or other optical function devices may be integrated thereinto.

Next, a manufacturing method of the DFB laser integrated semiconductor MZ modulator 700 according to the present embodiment will be described.

In the same manner as the first embodiment, as a crystal growth of the modulation waveguide 204, through the well-known crystal growth method using an organic metal vapor method, the n type InP clad layer 304, the InGaAsP lower side light guide layer 305, the active layer 306 formed of an undoped strain multiquantum well layer including an InGaAsP well layer and a barrier layer, and the InP cap layer are grown on the n type InP substrate 302. Next, a SiN film mask is formed in a region which will become the modulation waveguide 204, and a multi-layer structure corresponding to the modulation waveguide 204 is removed in regions other than the region which will become the modulation waveguide 204 through dry etching and wet etching.

Next, as a second crystal growth, in regions other than the region where the modulation waveguide 204 is formed, as multi-layer growth of the passive optical waveguide 202 (optical waveguide) and the Y branch 203, the InGaAsP lower side light guide layer 305, the quantum well active layer 306 formed of an InGaAsP well layer and a barrier layer, the InGaAsP upper side light guide layer 307, an InP spacer layer, and the diffraction grating layer 802 are sequentially formed using an organic metal vapor method. Next, in order to grow the passive optical waveguide 202 and the Y branch 203 as multiple layers, a SiN mask is formed in the DFB laser portion 701 and the modulation waveguide 204 portion, and the DFB laser multi-layer structure present in the passive optical waveguide 202 and the Y branch 203 is removed through dry etching and wet etching.

Next, as a third crystal growth, the InGaAsP lower side light guide layer 305, the quantum well active layer 306 formed of an InGaAsP well layer and a barrier layer, the InGaAsP upper side light guide layer 307, and the InP cap layer are sequentially formed as multi-layer growth of the passive optical waveguide 202 and the Y branch 203, using an organic metal vapor method. At this time, the DFB laser portion 701 and the modulation waveguide 204 are optically connected to the passive optical waveguide 202 and the Y branch 203.

Next, diffraction gratings are formed in the diffraction grating layer 802 of the region which will become the DFB laser portion 701 using an interference exposure method using photolithography, and, then, the p type InP clad layer 308, the p type contact layer 309 formed of a p type InGaAsP layer and a p type InGaAs layer, and a p type InP cap layer are grown as crystal in the entire wafer. In addition, the p type InP cap layer is removed in an intermediate process and thus is not left in a final structure. Here, a p type dopant uses, for example, Zn.

Thereafter, a low mesa with a height of, for example, about 2 μm, is formed in the DFB laser portion 701, and a high mesa optical waveguide of the height of, for example, about 4 μm is formed in the optical waveguide portion 201, through two steps of dry etching and wet etching. In addition, at this time, the mesa protector 205 is also formed.

Next, the passivation layer 311 is formed through a plasma CVD, and the resin 321 is coated on the passivation layer 311. In addition, an electrode hole is formed at the modulation waveguide 204 portion through etchback and through-hole processes. Further, the p side electrode 312, the lead wire 313, the electrode pad 314, and a p type electrode 801 are formed using an EB deposition method and a photolithography technique. Next, the n type InP substrate 302 is polished up to about 150 μm in a rear surface polishing process so as to form the n side electrode 301, and then a wafer process is completed through an electrode alloy process. Finally, a chip is formed for each DFB laser integrated semiconductor MZ modulator 700 from the wafer and undergoes end surface coating, thereby acquiring the DFB laser integrated semiconductor MZ modulator 700.

According to the present embodiment, the high mesa optical waveguide (the optical waveguide portion 201) is protected from mechanical contact by the mesa protector 205. Therefore, the mesa cracking of the optical waveguide portion 201 is reduced, and thus the semiconductor MZ modulator 501, a modulator module having the semiconductor MZ modulator 501, and the like can be stably produced at a high yield. Further, by forming the low dielectric resin 321 under the electrode pad 314 instead of semiconductor, it is possible to achieve low capacitance, and thus a high speed operation of 10 Gbit/s is possible.

In addition, the present invention is not limited to the first to third embodiments, and may be replaced with a configuration which is substantially the same as the configuration shown in the embodiments, a configuration achieving the same operations and effects, or a configuration achieving the same object. For example, although, in the above description, a case where the semiconductor MZ modulator 501 according to the second embodiment is integrated into the DFB laser portion 701 has been described, the semiconductor MZ modulator 106 according to the first embodiment may be integrated into the DFB laser portion 701. In addition, although, in the above description, the case using the semiconductor MZ modulator or the DFB laser has been described as an example, a modulator or a laser of a different type may be used as long as a configuration thereof is substantially the same as the configuration shown in the embodiments, a configuration thereof achieves the same operations and effects, or a configuration thereof achieves the same object. In addition, a material of each layer described above is an example, and the present invention is not limited thereto. For example, the substrate 302 may use materials such as GaAs, GaN, and ZnSe other than InP. Further, the optical waveguide portion 201 may be an active optical waveguide portion which emits light and guides the light.

What is claimed is:

1. An optical device comprising:
    a ridge-like optical waveguide portion;
    a mesa protector portion that is arranged in parallel to the optical waveguide portion;
    a resin portion that covers upper parts of the mesa protector portion and is disposed at both sides of the mesa protector portion;
    an electrode that is disposed on the optical waveguide portion;
    an electrode pad that is disposed on the resin portion located at an opposite side to the optical waveguide portion with respect to the mesa protector portion; and
    a connection portion that is disposed on the resin portion and electrically connects the electrode to the electrode pad,
    wherein the mesa protector portion is sandwiched between a left part of the resin portion and a right part of the resin portion, and
    wherein the connection portion extends from the electrode to the electrode pad passing above the mesa protector portion.

2. The optical device according to claim 1, wherein a height of the mesa protector portion is greater than a height of the optical waveguide portion.

3. The optical device according to claim 1, wherein a height of the mesa protector portion is substantially the same as a height of the optical waveguide portion.

4. The optical device according to claim 1, wherein a width of the mesa protector portion is substantially the same as a height of the optical waveguide portion.

5. The optical device according to claim 1, wherein the mesa protector portion includes a pair of mesa protectors disposed at both sides of the optical waveguide portion.

6. The optical device according to claim 5, wherein the resin portion is further disposed between the pair of mesa protectors and the ridge-like optical waveguide portion.

7. The optical device according to claim 1, wherein the optical waveguide portion includes:
    a first optical waveguide that guides incident light;
    a first branch portion that branches the light guided by the first optical waveguide;
    a plurality of modulation waveguides that modulate and guide the branched light;
    a second branch portion that combines the light from the plurality of modulation waveguides; and
    a second optical waveguide that guides the light from the second branch portion.

8. A modulator module comprising an optical device, wherein the optical device includes:
    a ridge-like optical waveguide portion;
    a mesa protector portion that is arranged in parallel to the optical waveguide portion;
    a resin portion that covers upper parts of the mesa protector portion and is disposed at both sides of the mesa protector portion;
    an electrode that is disposed on the optical waveguide portion;
    an electrode pad that is disposed on the resin portion located at an opposite side to the optical waveguide portion with respect to the mesa protector portion; and
    a connection portion that is disposed on the resin portion and electrically connects the electrode to the electrode pad,
    wherein the mesa protector portion is sandwiched between a left part of the resin portion and a right part of the resin portion, and
    wherein the connection portion extends from the electrode to the electrode pad passing above the mesa protector portion.

9. The modulator module according to claim 8 further comprising:
    a semiconductor laser that outputs light to the optical device,
    wherein the optical device and the semiconductor laser are integrated into the same substrate.

10. The modulator module according to claim 8, wherein a height of the mesa protector portion is greater than a height of the optical waveguide portion.

11. The modulator module according to claim 8, wherein a height of the mesa protector portion is substantially the same as a height of the optical waveguide portion.

12. The modulator module according to claim 8, wherein a width of the mesa protector portion is substantially the same as a height of the optical waveguide portion.

13. The modulator module according to claim 8, wherein the mesa protector portion includes a pair of mesa protectors disposed at both sides of the optical waveguide portion.

14. The modulator module according to claim 13, wherein the resin portion is further disposed between the pair of mesa protectors and the ridge-like optical waveguide portion.

15. The modulator module according to claim 8, wherein the optical waveguide portion includes:
    a first optical waveguide that guides incident light;
    a first branch portion that branches the light guided by the first optical waveguide;
    a plurality of modulation waveguides that modulate and guide the branched light;
    a second branch portion that combines the light from the plurality of modulation waveguides; and
    a second optical waveguide that guides the light from the second branch portion.

16. A manufacturing method of an optical device comprising:
    laminating at least a first clad layer, an active layer, and a second clad layer on a substrate so as to form a laminate structure;
    etching the laminate structure so as to form a ridge-like optical waveguide portion and a mesa protector portion arranged in parallel to the optical waveguide portion;
    forming a passivation layer on the etched laminate structure and forming a resin portion on the passivation layer; and
    forming an electrode portion extending from an upper part of the optical waveguide portion to an upper part of the resin portion located at an opposite side to the optical waveguide portion with respect to the mesa protector portion, wherein the mesa protector portion is sandwiched between a left part of the resin portion and a right part of the resin portion, and wherein the electrode portion passes above the mesa protector portion to extend from the upper part of the optical waveguide portion to the upper part of the resin portion.

17. The manufacturing method according to claim 16, wherein the mesa protector portion includes a pair of mesa protectors, and the resin portion is disposed between the pair of mesa protectors and the ridge-like optical waveguide portion.

* * * * *